United States Patent
Igeta et al.

(10) Patent No.: US 8,683,406 B2
(45) Date of Patent: Mar. 25, 2014

(54) METHOD OF DEFINING SHAPE AND POSITION OF DUMMY ACTIVE REGION BY PROCESSING DATA USING A PATTERNING APPARATUS

(75) Inventors: Mitsuaki Igeta, Kawasaki (JP); Masahiro Sueda, Kawasaki (JP); Rikio Takase, Kawasaki (JP); Akihiro Usujima, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/567,591

(22) Filed: Aug. 6, 2012

(65) Prior Publication Data

US 2012/0297353 A1 Nov. 22, 2012

Related U.S. Application Data

(62) Division of application No. 12/407,158, filed on Mar. 19, 2009, now abandoned.

(30) Foreign Application Priority Data

Jun. 20, 2008 (JP) ................................. 2008-161538

(51) Int. Cl.
*G06F 17/50* (2006.01)
*G01R 31/26* (2006.01)
*H01L 21/66* (2006.01)

(52) U.S. Cl.
USPC ............. 716/110; 716/118; 716/119; 438/14; 438/17

(58) Field of Classification Search
None
See application file for complete search history.

(56) References Cited

U.S. PATENT DOCUMENTS

| 6,838,736 | B2 | 1/2005 | Ishikura et al. |
| 8,032,844 | B2 * | 10/2011 | Hoshino .......................... 716/53 |
| 8,189,040 | B2 * | 5/2012 | Fujita et al. ...................... 348/61 |
| 8,362,785 | B2 * | 1/2013 | Tamegaya ...................... 324/548 |
| 2002/0127791 | A1 | 9/2002 | Nanjo et al. |
| 2004/0097051 | A1 | 5/2004 | Wu et al. |
| 2005/0006707 | A1 | 1/2005 | Eriguchi et al. |

(Continued)

FOREIGN PATENT DOCUMENTS

| JP | 3-30468 | 2/1991 |
| JP | 9-297388 | 11/1997 |

(Continued)

OTHER PUBLICATIONS

USPTO, (Jung) Notice of Non-Compliant Amendment, Jul. 5, 2012, in U.S. Appl. No. 12/407,158 [pending].

(Continued)

*Primary Examiner* — Michael Jung
(74) *Attorney, Agent, or Firm* — Fujitsu Patent Center

(57) ABSTRACT

A patterning method includes defining, in the case of an electric current which exceeds an allowable limit flowing between first conduction type well regions arranged in a semiconductor substrate, a first pattern between the first conduction type well regions; defining a second pattern by removing, in the case of a first region in which arrangement is inhibited being in the first pattern, the first region from the first pattern; defining a third pattern by removing, in the case of a second region which exceeds a fabrication limit being in the second pattern, the second region from the second pattern; and using the third pattern as a dummy active region in a second conduction type well region arranged in the semiconductor substrate.

7 Claims, 12 Drawing Sheets

(56) References Cited

U.S. PATENT DOCUMENTS

| | | |
|---|---|---|
| 2006/0252227 A1 | 11/2006 | Lee et al. |
| 2008/0028361 A1* | 1/2008 | Yamanaka et al. ............ 716/21 |
| 2008/0203524 A1 | 8/2008 | Anderson et al. |
| 2010/0164004 A1 | 7/2010 | Chatterjee et al. |

FOREIGN PATENT DOCUMENTS

| | | |
|---|---|---|
| JP | 11-297853 A | 10/1999 |
| JP | 2000-12680 | 1/2000 |
| JP | 2002-289704 A | 10/2002 |
| JP | 2003-324149 | 11/2003 |
| JP | 2003-337843 A | 11/2003 |

OTHER PUBLICATIONS

USPTO, (Jung) Non-Final Rejection, Jan. 9, 2012, in U.S. Appl. No. 12/407,158 [pending].
USPTO, (Jung) Final Rejection, Oct. 28, 2010, in U.S. Appl. No. 12/407,158 [pending].
USPTO, (Jung) Non-Final Rejection, Apr. 7, 2010, in U.S. Appl. No. 12/407,158 [pending].
USPTO, (Jung) Restriction Requirement, Jan. 4, 2010, in U.S. Appl. No. 12/407,158 [pending].
Japanese Office Action mailed Mar. 19, 2013 for corresponding Japanese Application No. 2008-161538, with Partial English-language Translation.

* cited by examiner

METHOD OF DEFINING SHAPE AND POSITION OF DUMMY ACTIVE REGION BY PROCESSING DATA USING A PATTERNING APPARATUS

CROSS-REFERENCE TO RELATED APPLICATIONS

This application is a divisional of application Ser. No. 12/407,158, filed Mar. 19, 2009, which is based upon and claims the benefits of priority of the prior Japanese Patent Application No. 2008-161538, filed on Jun. 20, 2008, the entire contents of which are incorporated herein by reference.

FIELD

The embodiments discussed herein are related to a patterning method and a semiconductor device.

BACKGROUND

In recent years semiconductor devices in which shallow trench isolation (STI) is put to practical use have been manufactured. An n-type well region is isolated from a p-type well region by the STI.

Japanese Laid-Open Patent Publication No. 2000-012680 discloses with p-channel metal oxide semiconductors (MOSes) which are typical semiconductor elements, for example, an n-type well region is formed in a p-type silicon (Si) substrate. The n-type well region has a predetermined depth from the surface of the p-type Si substrate. An active region is formed in the n-type well region. Source/drain regions, a gate oxide film, a gate electrode, and the like are formed in the active region. By doing so, a p-channel MOS is formed.

In addition, Japanese Laid-Open Patent Publication No. 03-030468 discloses a triple well structure in which a p-type well region of a p-type silicon substrate in which an n-channel MOS transistor is formed is surrounded by an n-type well region has recently been proposed.

However, with a recent increase in the integration level of semiconductor devices there is a tendency for a space between n-type well (or p-type well) regions to become narrower. Therefore, if n-type well (or p-type well) regions differ in electric potential, then a leakage current may flow between the n-type well (or p-type well) regions. As a result, excess electric power is consumed in a semiconductor device, power supply potential drops in the semiconductor device, or latch-up is caused by the leakage current in the semiconductor device.

SUMMARY

According to an aspect of the embodiment, a patterning method includes: defining, in the case of an electric current which exceeds an allowable limit flowing between first conduction type well regions arranged in a semiconductor substrate, a first pattern between the first conduction type well regions; defining a second pattern by removing, in the case of a first region in which arrangement is inhibited being in the first pattern, the first region from the first pattern; defining a third pattern by removing, in the case of a second region which exceeds a fabrication limit being in the second pattern, the second region from the second pattern; and using the third pattern as a dummy active region in a second conduction type well region arranged in the semiconductor substrate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
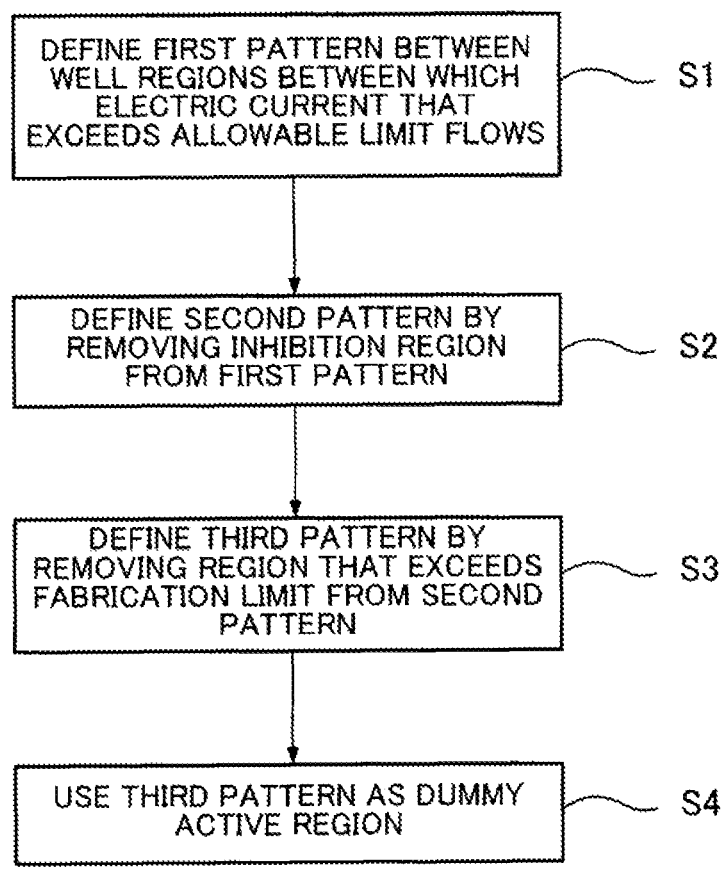
FIG. 1 is a view for describing the flow of a patterning method according to a first embodiment.

A patterning method and a semiconductor device according to embodiments will now be described in detail with reference to the accompanying drawings, wherein like reference numerals refer to like elements throughout.

First Embodiment

A patterning method according to a first embodiment will be described first.

FIG. 1 is a view for describing the flow of a patterning method according to a first embodiment.

If an electric current which exceeds an allowable limit flows between first conduction type well regions arranged in a semiconductor substrate, a first pattern is defined first between the first conduction type well regions (step S1).

If a first region in which arrangement is inhibited is in the first pattern, a second pattern is defined next by removing the first region from the first pattern (step S2).

If a second region which exceeds a fabrication limit is in the second pattern, a third pattern is defined by removing the second region from the second pattern (step S3). The third pattern is used as a dummy active region in a second conduction type well region arranged in the semiconductor substrate (step S4).

By following the above flow, a dummy active region is defined between n-type well (or p-type well) regions. When a wafer process is performed in order to form such a pattern, a p-type well (or an n-type well) region in which impurity concentration is high is formed locally between the n-type well (or p-type well) regions and a leakage current which flows between the n-type well (or p-type well) regions is controlled.

The structure of a semiconductor device including the above dummy active region will now be described.

Figure 2A:
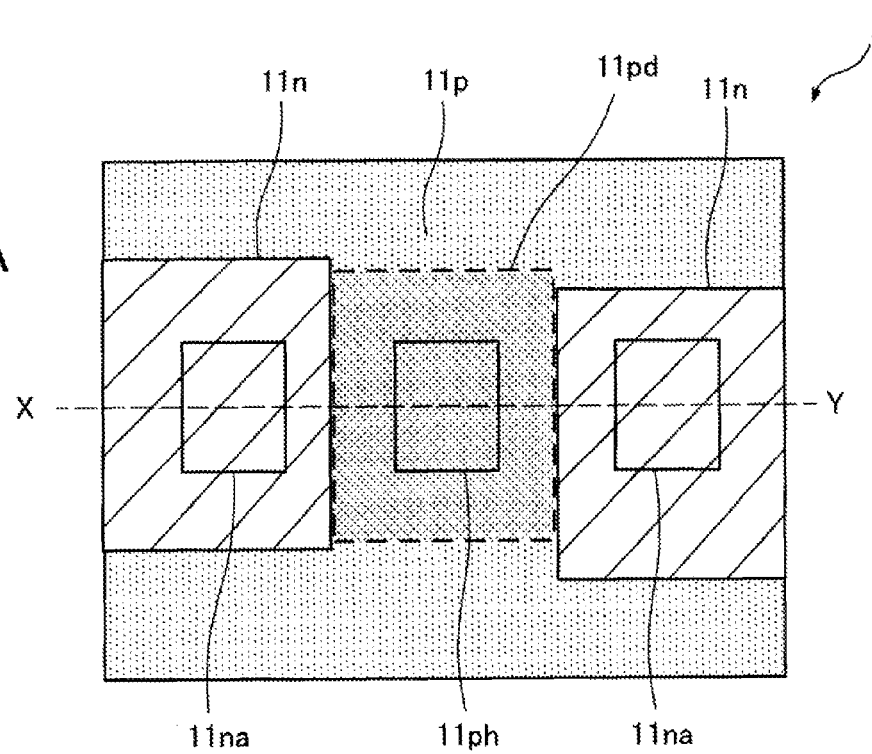
FIGS. 2A and 2B are fragmentary views of a semiconductor device according to a first embodiment, FIG. 2A being a fragmentary plan view of the semiconductor device, FIG. 2B being a fragmentary sectional view taken along the line X-Y of FIG. 2A.
Figure 2B:
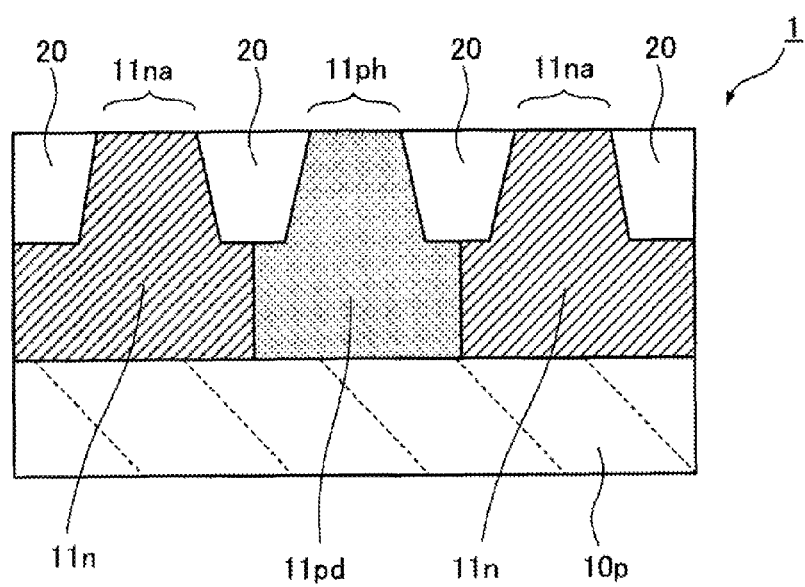

FIGS. 2A and 2B are fragmentary views of a semiconductor device according to a first embodiment. FIG. 2A is a fragmentary plan view of the semiconductor device. FIG. 2B is a fragmentary sectional view taken along the line X-Y of FIG. 2A. In FIG. 2A, STIs 20 are not depicted in order to clearly indicate well regions arranged in a semiconductor substrate. A semiconductor device 1 depicted in FIGS. 2A and 2B has a twin well structure.

With the semiconductor device 1 a p-type semiconductor substrate $10p$ the main component of which is silicon or the like is used as a supporting substrate. n-type well regions $11n$ are arranged in the p-type semiconductor substrate $10p$ and a p-type well region $11p$ is arranged in the p-type semiconductor substrate $10p$ other than the n-type well regions $11n$ (see FIG. 2A). An STI 20 (not depicted in FIG. 2A) is arranged between an n-type well region $11n$ and the p-type well region $11p$ and each of the n-type well regions $11n$ and the p-type well region $11p$ is defined in the p-type semiconductor substrate $10p$.

The main component of the STIs 20 is, for example, silicon oxide ($SiO_2$).

The surface of each n-type well region $11n$ of the semiconductor device 1 is exposed from between STIs 20. That is to say, an active region $11na$ can be formed in the surface of each n-type well region $11n$. For example, by arranging a p-channel MOS transistor in the active region $11na$, an element is formed in each n-type well region $11n$.

With the semiconductor device 1 a dummy active region $11ph$ which is exposed from between STIs 20 is arranged between the n-type well regions $11n$.

The reason for arranging the dummy active region $11ph$ in such a position will now be described.

After the STIs 20 are formed in the p-type semiconductor substrate $10p$ by a wafer process, the n-type well regions $11n$ and the p-type well region $11p$ are formed by implanting impurity ions from the surface of the p-type semiconductor substrate $10p$.

Accordingly, if the above dummy active region $11ph$ is arranged in advance between the n-type well regions $11n$, then a p-type well region $11pd$ in which impurity concentration is higher than impurity concentration in the p-type well region $11p$ and in which impurities deeply diffuse is formed under the dummy active region $11ph$ by a wafer process.

For example, the above STIs 20 are not formed in the dummy active region $11ph$. Therefore, by performing the wafer process, p-type impurity ions (boron (B) ions, for example) are implanted under the dummy active region $11ph$ therethrough. As a result, a local region (p-type well region $11pd$) in which impurity concentration is higher than impurity concentration in the p-type well region $11p$ and in which impurities deeply diffuse is formed under the dummy active region $11ph$.

If the p-type well region $11pd$ is formed, a potential barrier between the p-type well region $11pd$ and an n-type well region $11n$ becomes higher. As a result, it is difficult for an electric current to flow between the p-type well region $11pd$ and the n-type well region $11n$. Accordingly, even if the n-type well regions $11n$ differ in electric potential, a leakage current which flows between the n-type well regions $11n$ is controlled under an allowable limit.

Figure 3A:
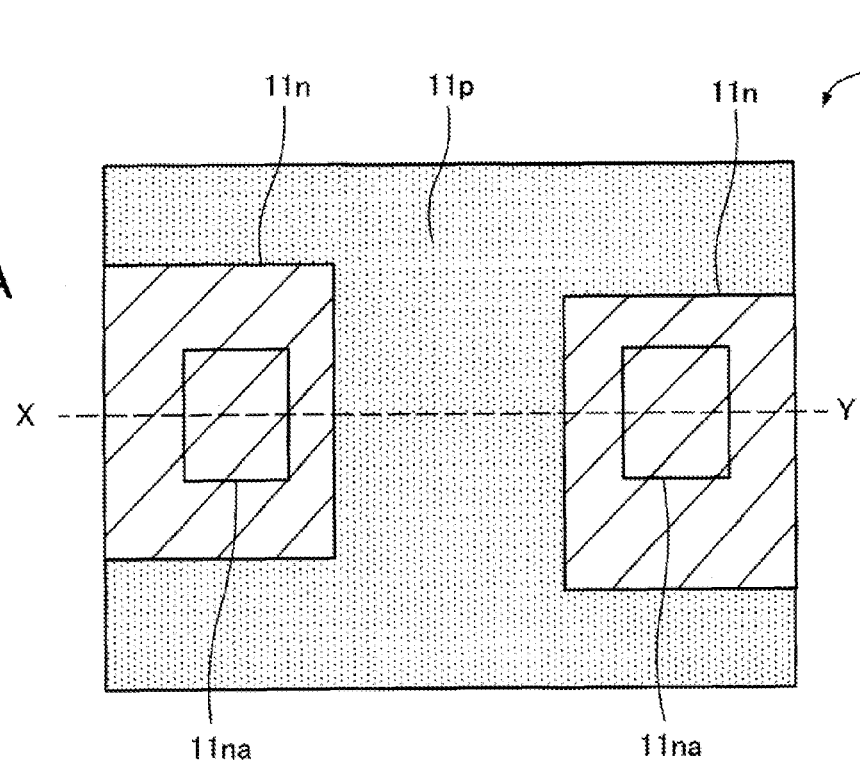
FIGS. 3A and 3B are fragmentary views of another semiconductor device.
Figure 3B:
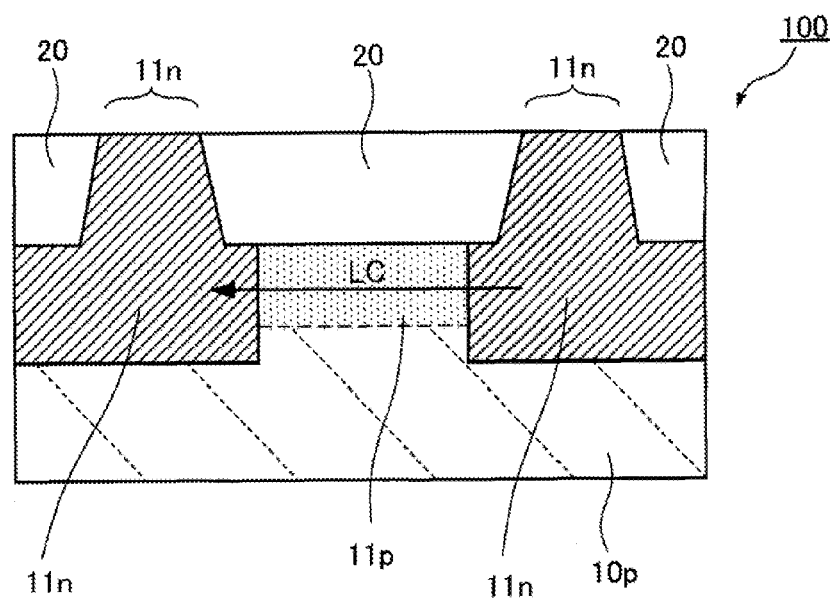

In order to describe this phenomenon in further detail, fragmentary views of another semiconductor device are depicted in FIGS. 3A and 3B for comparison. The numeric values below are indicated as examples and other numeric values may be used.

As depicted in FIGS. 3A and 3B, a semiconductor device 100 does not include the above dummy active region $11ph$. With the semiconductor device 100 having such a structure, an opening is not formed in each STI 20. Therefore, even if a wafer process is performed, the above local region (p-type well region $11pd$) is not formed. That is to say, only an ordinary p-type well region $11p$ in which impurity concentration is lower than impurity concentration in the above p-type well region $11pd$ is formed between n-type well regions $11n$.

Therefore, a potential barrier between the p-type well region $11p$ and an n-type well region $11n$ is low compared with the semiconductor device 1. That is to say, a leakage current LC may flow between the n-type well regions $11n$.

With the semiconductor device 100 an electric current which exceeds the allowable limit, or a leakage current may flow if the distance between the n-type well regions $11n$ is shorter than or equal to a predetermined value (1 μm, for example). For example, if the distance between the n-type well regions $11n$ is 1 μm, an electric current of 1 μA or more is defined as a leakage current.

Accordingly, in order to control a leakage current which flows between the n-type well regions $11n$, it is desirable that the structure of the semiconductor device 1 depicted in FIGS. 2A and 2B is adopted.

With the semiconductor device 1 the dummy active region $11ph$ is formed for this reason.

The shape and position of the dummy active region $11ph$ are automatically defined by, for example, a patterning apparatus using a computer aided design (CAD) system.

For example, the distance between the n-type well regions $11n$ between which a leakage current flows is set in advance (to, for example, 1 μm or less) and the distance between the n-type well regions $11n$ is detected. By doing so, the dummy active region $11ph$ is automatically defined.

In addition, the dummy active region $11ph$ is automatically defined at a predetermined distance (1 μm or less, for example) from, for example, a control wiring (wiring for a gate electrode) the main component of which is polycrystalline silicon.

If the above p-type well region $11pd$ is formed near the control wiring, then a combination of the control wiring and the p-type well region $11pd$ forms an element which is not desired in the p-type semiconductor substrate $10p$.

Furthermore, the dummy active region $11ph$ is automatically defined at a predetermined distance (1 μm or less, for example) from a boundary between well regions.

If the dummy active region $11ph$ is formed across a boundary between an n-type well region $11n$ and the p-type well region $11p$, then a metal layer arranged over the boundary by a wafer process short-circuits the n-type well region $11n$ and the p-type well region $11p$.

Moreover, the dummy active region $11ph$ is automatically defined at a predetermined distance (1 μm or less, for example) from an active region, a wiring layer, and a parasitic element.

If the above p-type well region $11pd$ is formed near the active region, the wiring layer, or the parasitic element, then variation in capacitance between the active region, the wiring layer, or the parasitic element and the above p-type well region 11pd which is not desired occurs. It is desirable that the dummy active region 11ph is defined at a predetermined distance (1 μm or less, for example) from a member (high-frequency circuit section, for example) in particular which is easily influenced by capacitance.

In addition, if the p-type well region 11pd is formed near a member other than the above members, the p-type well region 11pd may have a bad influence on the characteristics of an element. In this case, it is desirable that the dummy active region 11ph is defined at a predetermined distance from the member.

A concrete procedure for automatically defining the above dummy active region (dummy active region 11ph) in position in the p-type semiconductor substrate 10p will now be described.

FIGS. 4 through 8 are fragmentary views for describing the flow of automatically defining the dummy active region. Members in FIGS. 4 through 8 that are the same as those depicted in FIG. 1 are marked with the same symbols. In the following descriptions a member described once will not be described again. The STIs 20 are not depicted in FIGS. 4 through 8.

Figure 4:
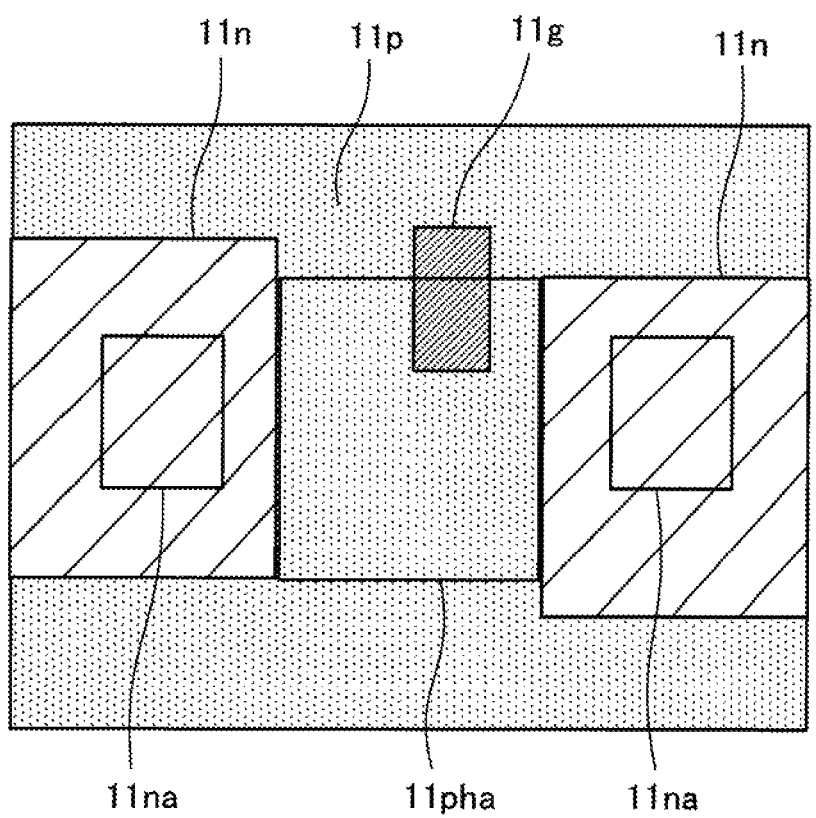
FIG. 4 is a fragmentary view for describing the flow of automatically defining a dummy active region (part 1)

A state in which a plurality of n-type well regions 11n are arranged over a semiconductor substrate (p-type semiconductor substrate 10p, for example) is depicted in FIG. 4. A region 11g in which a control wiring is arranged is also depicted in FIG. 4.

Such patterns are stored in a patterning apparatus as design data (original data). For example, each pattern is stored in a storage section of the patterning apparatus, a management server, or a record medium as design data.

A data processing section of the patterning apparatus automatically selects a region between n-type well regions 11n in which a leakage current flows easily.

For example, if the data processing section of the patterning apparatus determines that the distance between the n-type well regions 11n depicted in FIG. 4 is shorter than or equal to a threshold (1 μm, for example) indicative of whether a leakage current flows, then the data processing section of the patterning apparatus automatically defines a pattern 11pha between the n-type well regions 11n.

When the data processing section of the patterning apparatus defines the pattern 11pha, the data processing section of the patterning apparatus makes determination on the basis of the distance between the n-type well regions 11n. In addition, a pattern may be defined between n-type well regions 11n which differ in function or between n-type well regions 11n which differ in electric potential.

Figure 5:
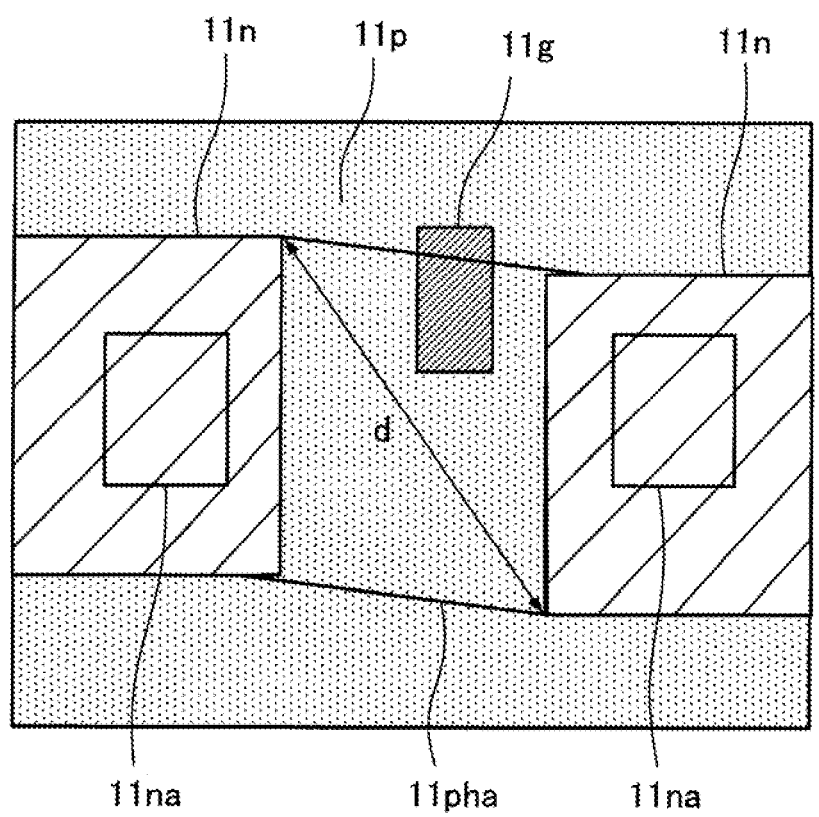
FIG. 5 is a fragmentary view for describing the flow of automatically defining the dummy active region (part 2)

In FIG. 4 the rectangular pattern 11pha is defined over the semiconductor substrate. However, the shape of the pattern 11pha is not limited to this shape. As depicted in FIG. 5, for example, if the data processing section of the patterning apparatus determines that distance d between the n-type well regions 11n in the direction of a diagonal is shorter than or equal to a threshold (1 μm, for example) indicative of whether a leakage current flows, then the data processing section of the patterning apparatus may define a pattern 11pha having a shape depicted in FIG. 5 over the semiconductor substrate.

Next, a region in which arrangement is inhibited is removed from the pattern 11pha.

For example, if a boundary between an n-type well region 11n and a p-type well region 11p is near the pattern 11pha, then a region which extends over a certain distance (1 μm, for example, set as a threshold) from the boundary is selected and is removed from the pattern 11pha.

In addition, if the region 11g in which the control wiring is arranged is near the pattern 11pha, then a region which extends over a certain distance (greater than or equal to, for example, 1 μm which is a threshold) from the region 11g is selected and is removed from the pattern 11pha.

Figure 6:
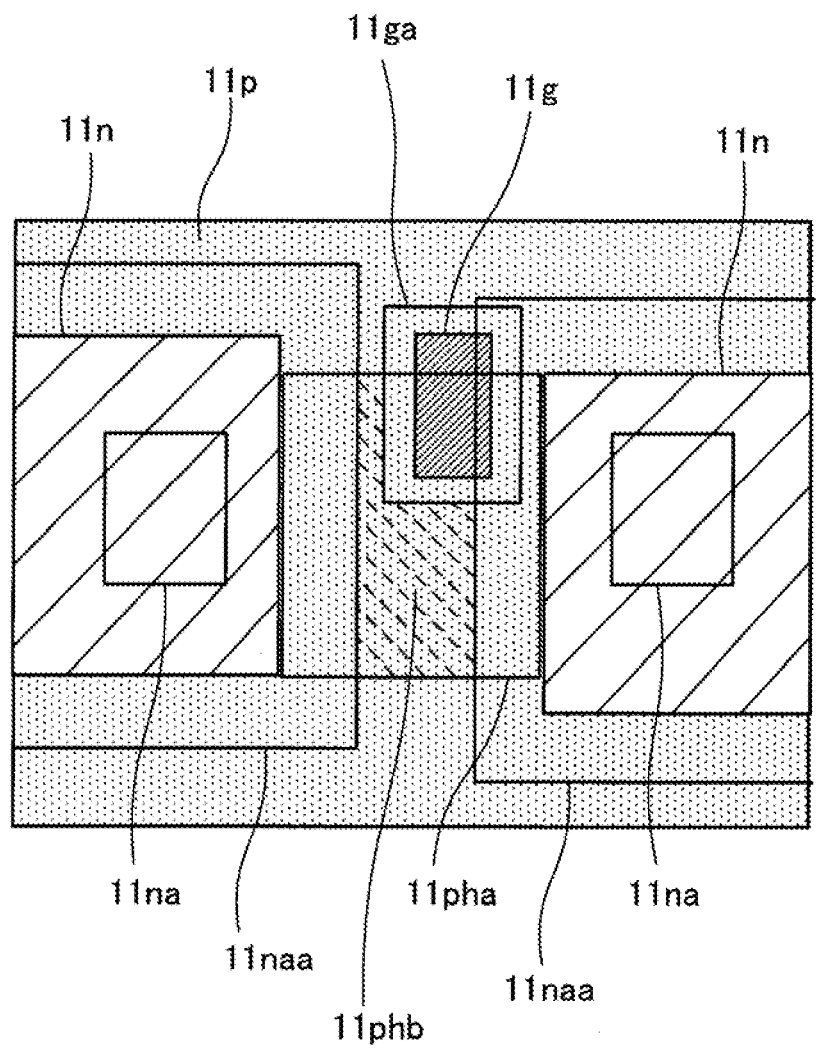
FIG. 6 is a fragmentary view for describing the flow of automatically defining the dummy active region (part 3)

As depicted in FIG. 6, a pattern 11phb (indicated by oblique dashed lines) which is different from the pattern 11pha is defined by performing the above processes.

As depicted in FIG. 6, each portion (each region 11naa) which extends over a predetermined distance from a boundary between an n-type well region 11n and the p-type well region 11p is removed from the pattern 11pha. In addition, a portion (region 11ga) which extends over a predetermined distance from the region 11g is removed from the pattern 11pha.

The process of removing a region in which arrangement is inhibited is automatically performed by the data processing section of the patterning apparatus.

In addition to the above regions, a region which extends over a certain distance from at least one of an active region, a wiring layer, and an element arranged in the semiconductor substrate may be selected as a region in which arrangement is inhibited.

Next, a region which exceeds a fabrication limit from the viewpoint of a manufacturing process is removed further from the pattern 11phb.

Figure 7:
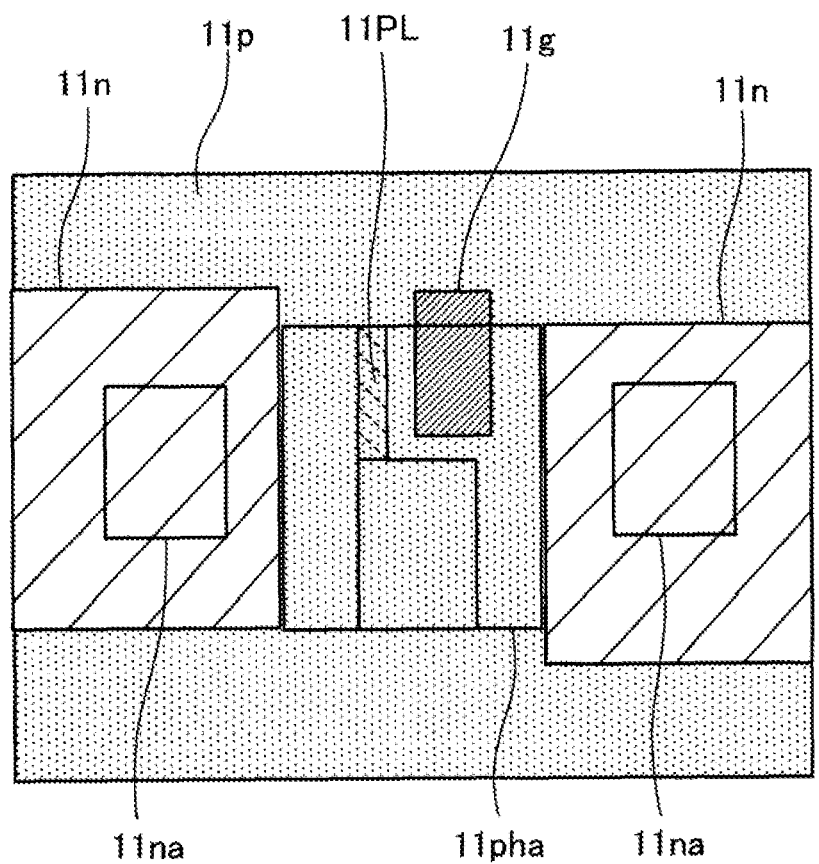
FIG. 7 is a fragmentary view for describing the flow of automatically defining the dummy active region (part 4)

For example, if the pattern width of a region 11PL (indicated by oblique dashed lines) depicted in FIG. 7 exceeds the fabrication limit, then the region 11PL is removed from the above pattern 11phb.

The fabrication limit is set on the basis of the limit of patterning by a dry or wet wafer process, the limit of the fabrication of a mask member used in photolithography, or the like. Information regarding the fabrication limit is stored in the storage section of the patterning apparatus or the like as a database. The process of removing a region which exceeds the fabrication limit is also performed automatically by the data processing section of the patterning apparatus.

A region obtained by removing the region 11PL from the above pattern 11phb is defined as a finally shaped opening pattern, or a dummy active region 11ph.

Figure 8:
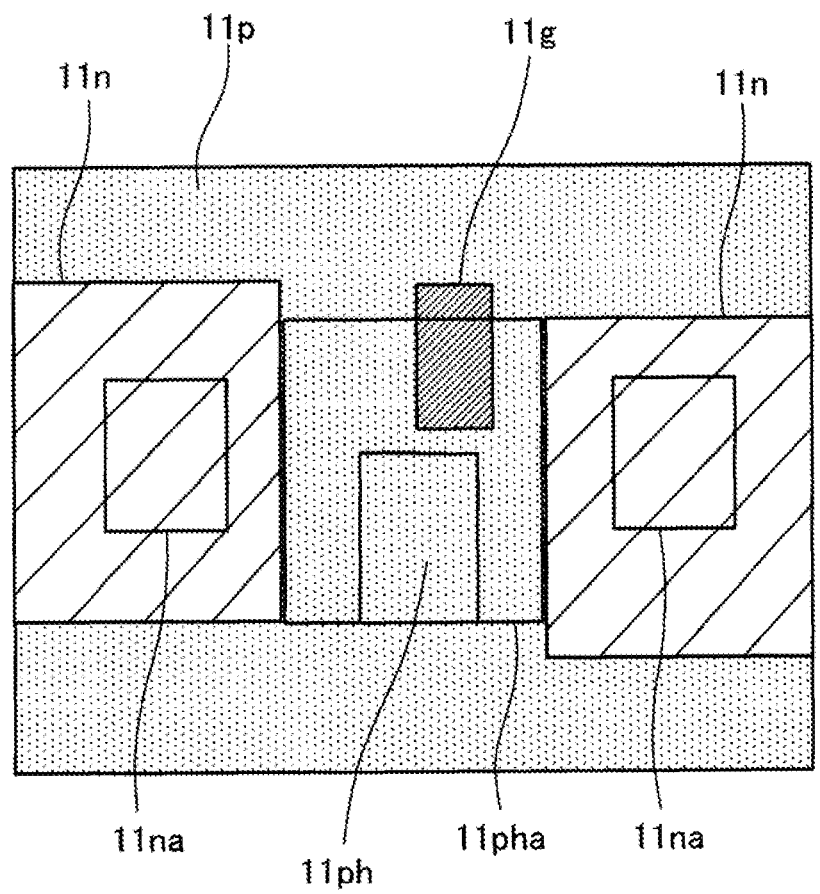
FIG. 8 is a fragmentary view for describing the flow of automatically defining the dummy active region (part 5)

This state is depicted in FIG. 8.

The shape, position, and the like of the finally defined dummy active region 11ph are stored in the storage section of the patterning apparatus or the like as the design data.

The width of a margin set for the positional deviation of a mask member may be taken into consideration in shaping a pattern.

Figure 9:
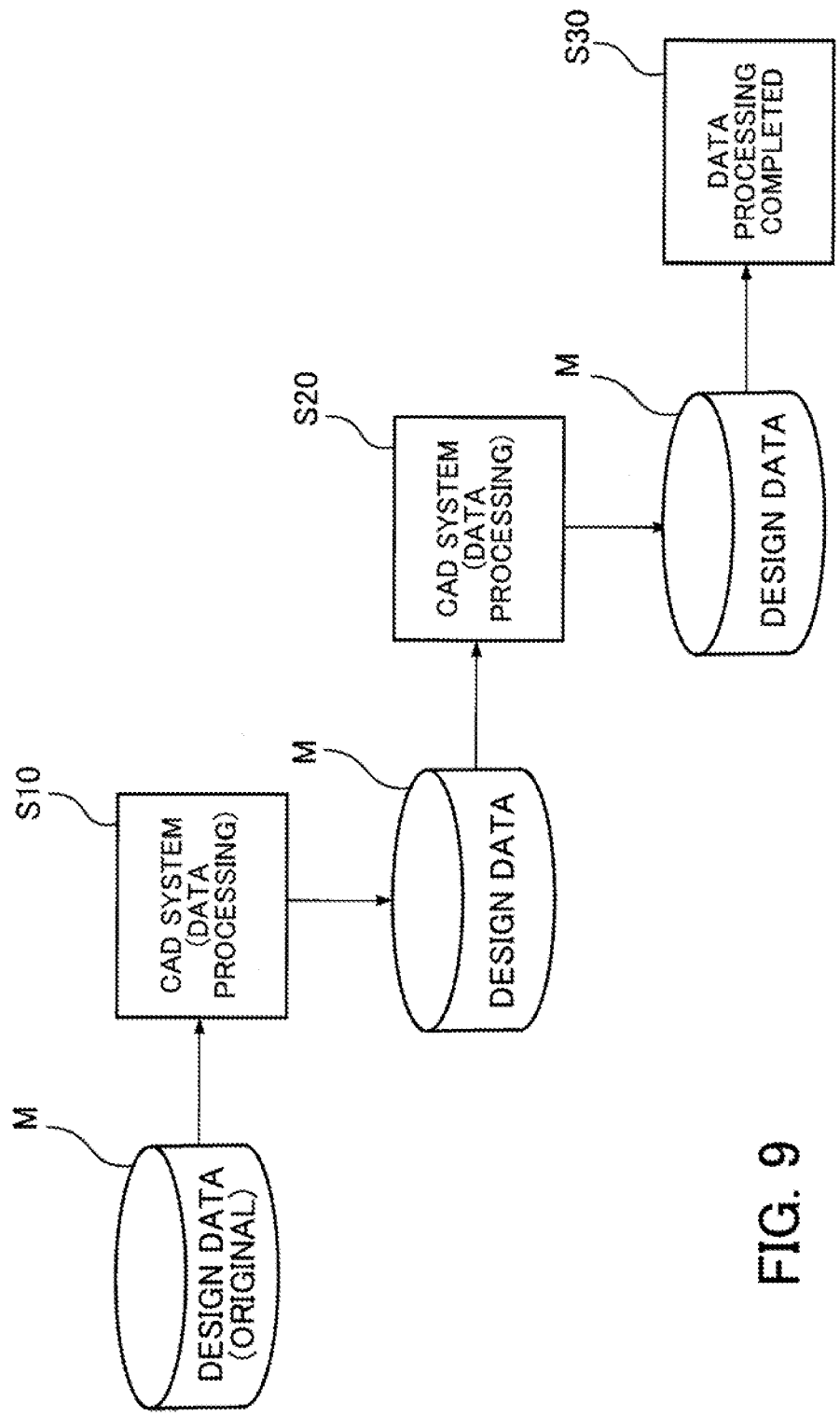
FIG. 9 is a view for describing the flow of data processing by a patterning apparatus.

The above procedure described from the viewpoint of the flow of data processing by the patterning apparatus is depicted in FIG. 9.

FIG. 9 is a view for describing the flow of data processing by the patterning apparatus.

Original design data is read out first from a storage section M of the patterning apparatus.

Such design data is stored in the storage section M in, for example, GDSII format.

Next, if a portion where a leakage current flows is detected between n-type well regions 11n read out, then the pattern 11pha is defined between the n-type well regions 11n.

Next, if a region in which arrangement is inhibited is in the pattern 11pha, then the pattern 11phb is defined by removing the region from the pattern 11pha.

Next, if a region which exceeds the fabrication limit is in the pattern 11phb, then a new pattern, or the dummy active region 11ph is defined by removing the region from the pattern 11phb.

The pattern 11*pha*, the pattern 11*phb*, and the dummy active region 11*ph* are automatically defined by the data processing section of the patterning apparatus (step S10).

Data (shape, position, and the like) regarding the dummy active region 11*ph* is stored in the storage section M of the patterning apparatus.

Next, the data processing section of the patterning apparatus automatically superimposes the data regarding the dummy active region 11*ph* on the original design data (step S20).

Data obtained by superimposing the data regarding the dummy active region 11*ph* on the original design data is stored in the storage section M of the patterning apparatus.

By doing so, the data processing of superimposing the data regarding the dummy active region 11*ph* on the original design data is completed (step S30).

A wafer process is performed on the basis of a pattern finally designed by the patterning apparatus. As a result, the dummy active region 11*ph* which is exposed from between STIs 20 is formed. In addition, the p-type well region 11*pd* is formed inevitably under the dummy active region 11*ph*. Accordingly, a leakage current between n-type well regions 11*n* is controlled.

As has been described, the following method is used in the first embodiment. If an electric current which exceeds the allowable limit flows between the first conduction type well regions arranged in the semiconductor substrate, the first pattern is defined between the first conduction type well regions. If the first region in which arrangement is inhibited is in the first pattern, the second pattern is defined by removing the first region from the first pattern. If the second region which exceeds the fabrication limit is in the second pattern, the third pattern is defined by removing the second region from the second pattern. The third pattern is used as the dummy active region in the second conduction type well region arranged in the semiconductor substrate.

With the semiconductor device 1 fabricated by this method, a leakage current between the n-type well regions 11*n* is controlled. As a result, excess electric power is not consumed in the semiconductor device 1 and power supply potential applied to the semiconductor device 1 does not drop. In addition, latch-up caused by a leakage current does not occur in the semiconductor device 1.

Patterning can be modified (dummy active region 11*ph* can be defined) only by modifying a mask member used in a real wafer process for forming the STIs 20.

Therefore, there is no need to change process conditions under which the semiconductor device 1 is fabricated or to add fabrication steps. The dummy active region 11*ph* is easily formed in the semiconductor substrate. The costs of fabrication steps do not rise.

Furthermore, the dummy active region 11*ph* is formed between the n-type well regions 11*n* of the semiconductor device 1, so the area of the semiconductor device 1 does not increase.

Second Embodiment

Figure 10A:
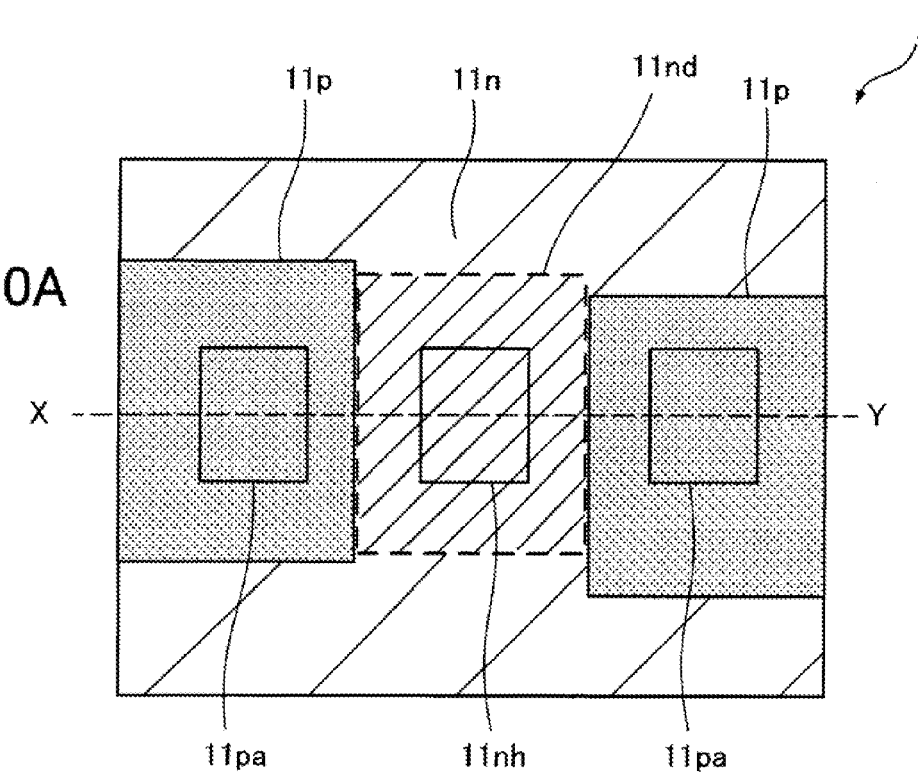
FIGS. 10A and 10B are fragmentary views of a semiconductor device according to a second embodiment, FIG. 10A being a fragmentary plan view of the semiconductor device, FIG. 10B being a fragmentary sectional view taken along the line X-Y of FIG. 10A.
Figure 10B:
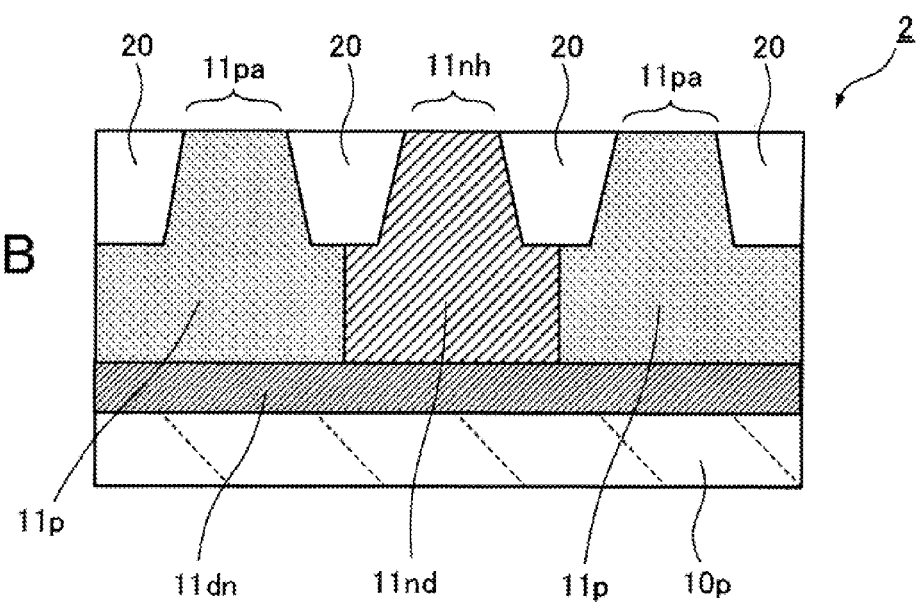

FIGS. 10A and 10B are fragmentary views of a semiconductor device according to a second embodiment. FIG. 10A is a fragmentary plan view of the semiconductor device. FIG. 10B is a fragmentary sectional view taken along the line X-Y of FIG. 10A. In FIG. 10A, STIs 20 are not depicted in order to clearly indicate well regions arranged in a semiconductor substrate. A semiconductor device 2 depicted in FIGS. 10A and 10B has a triple well structure.

With the semiconductor device 2 a p-type semiconductor substrate 10*p*, for example, is used as a supporting substrate. In addition, an n-type well region 11*dn* is arranged in a deep region of the p-type semiconductor substrate 10*p*.

Furthermore, p-type well regions 11*p* are arranged over the n-type well region 11*dn* and an n-type well region 11*n* is arranged in the p-type semiconductor substrate 10*p* other than the p-type well regions 11*p* over the n-type well region 11*dn* (see FIGS. 10A and 10B). An STI 20 (not depicted in FIG. 10A) is arranged between a p-type well region 11*p* and the n-type well region 11*n* and each of the p-type well regions 11*p* and the n-type well region 11*n* is defined in the p-type semiconductor substrate 10*p*.

The surface of each p-type well region 11*p* of the semiconductor device 2 is exposed from between STIs 20. That is to say, an active region 11*pa* can be formed in the surface of each p-type well region 11*p*. For example, by arranging an n-channel MOS transistor in the active region 11*pa*, an element is formed in each p-type well region 11*p*.

With the semiconductor device 2 a dummy active region 11*nh* which is exposed from between STIs 20 is arranged between the p-type well regions 11*p*.

The reason for arranging the dummy active region 11*nh* in such a position is the same as that described in the first embodiment. That is to say, by performing a wafer process, n-type impurity ions (phosphorus (P) ions, for example) are implanted under the dummy active region 11*nh* therethrough. As a result, a local region (n-type well region 11*nd*) in which impurity concentration is higher than impurity concentration in the n-type well region 11*n* and in which impurities deeply diffuse is formed under the dummy active region 11*nh*.

If the n-type well region 11*nd* is formed, a potential barrier between the n-type well region 11*nd* and a p-type well region 11*p* becomes higher. As a result, it is difficult for an electric current to flow between the n-type well region 11*nd* and the p-type well region 11*p*. Accordingly, even if the p-type well regions 11*p* differ in electric potential, a leakage current which flows between the p-type well regions 11*p* is controlled under an allowable limit.

Figure 11A:
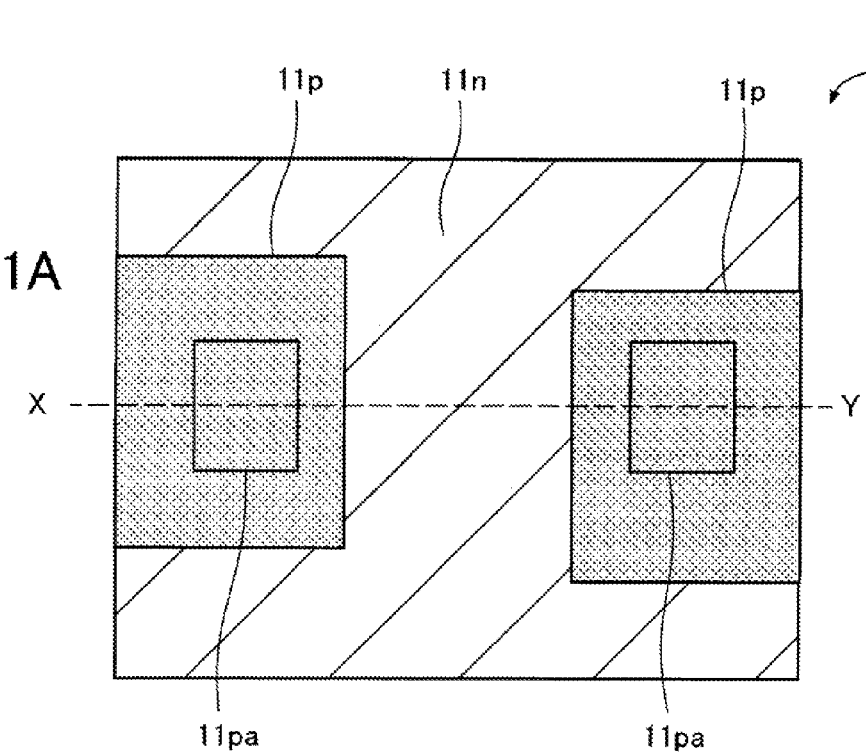
FIGS. 11A and 11B are fragmentary views of another semiconductor device.
Figure 11B:
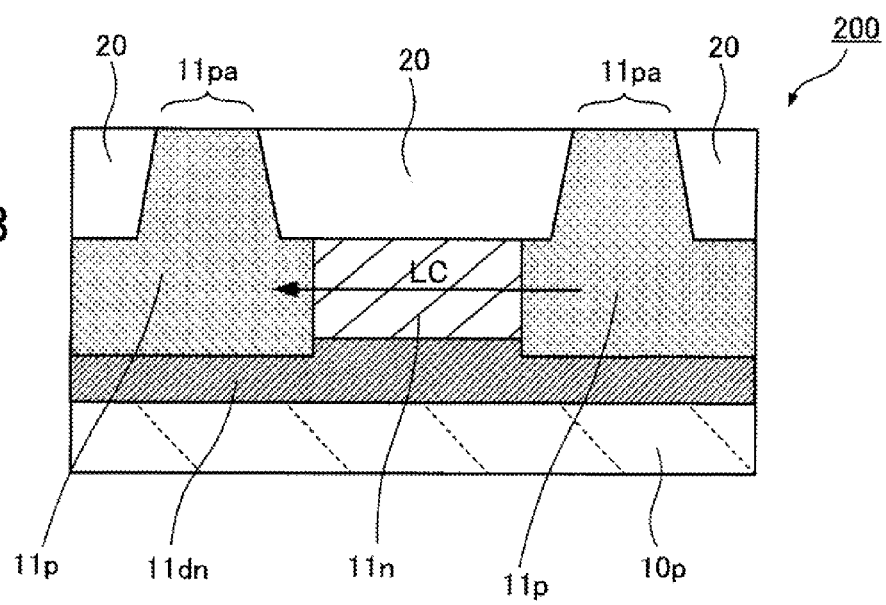

In order to describe this phenomenon in further detail, fragmentary views of another semiconductor device are depicted in FIGS. 11A and 11B for comparison.

As depicted in FIGS. 11A and 11B, a semiconductor device 200 does not include the above dummy active region 11*nh*. With the semiconductor device 200 having such a structure, an opening is not formed in each STI 20. Therefore, even if a wafer process is performed, the above local region (n-type well region 11*nd*) is not formed. That is to say, only an ordinary n-type well region 11*n* in which impurity concentration is lower than impurity concentration in the above n-type well region 11*nd* is formed between p-type well regions 11*p*.

Therefore, a potential barrier between the n-type well region 11*n* and a p-type well region 11*p* is low compared with the semiconductor device 2. That is to say, a leakage current LC may flow between the p-type well regions 11*p*.

As described in the first embodiment, the shape and position of the dummy active region 11*nh* are automatically defined by the above patterning apparatus.

Furthermore, as described in the first embodiment, the dummy active region 11*nh* is automatically defined at a predetermined distance from a control wiring (gate electrode wiring), a boundary between well regions, an active region, a wiring layer, or a parasitic element.

In addition, if the n-type well region 11*nd* is formed near a member other than the above members, the n-type well region 11*nd* may have a bad influence on the characteristics of an element. In this case, it is desirable that the dummy active region 11nh is defined at a predetermined distance from the member.

The same effects that are obtained by the semiconductor device 1 according to the first embodiment can be achieved by the semiconductor device 2 according to the second embodiment.

Third Embodiment

Figure 12:
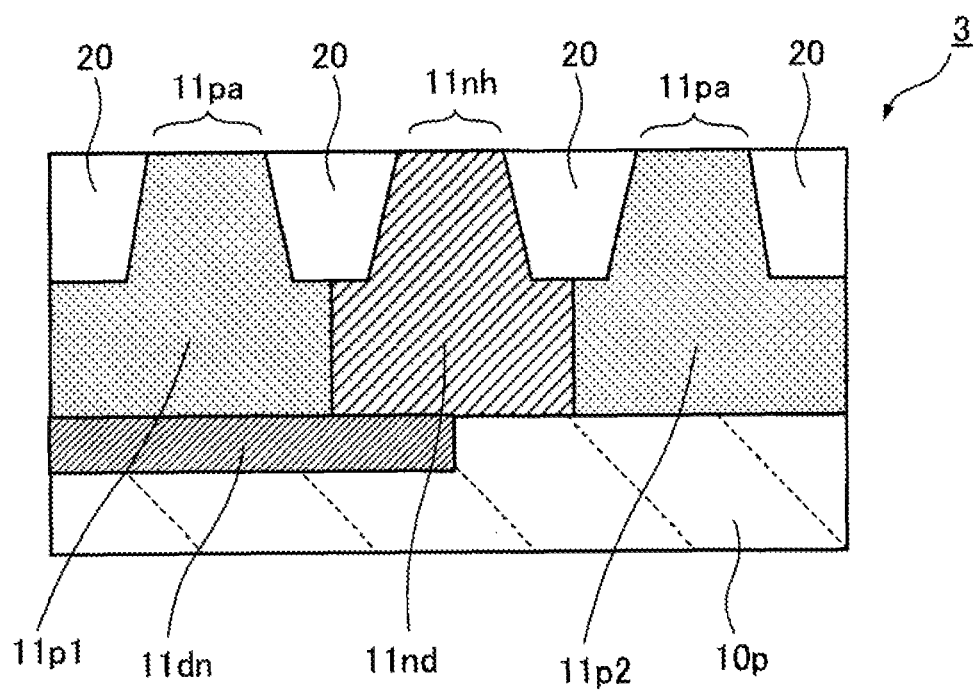
FIG. 12 is a fragmentary view of a semiconductor device according to a third embodiment.

FIG. 12 is a fragmentary view of a semiconductor device according to a third embodiment.

A semiconductor device 3 has a structure which is a modification of a triple well structure.

With the semiconductor device 3 a p-type semiconductor substrate 10p, for example, is used as a supporting substrate. In addition, an n-type well region 11dn is arranged in part of a deep region of the p-type semiconductor substrate 10p.

Furthermore, a p-type well region 11p1 and an n-type well region 11nd are arranged over the n-type well region 11dn. A p-type well region 11p2 is adjacent to the n-type well region 11nd. The p-type well region 11p1 is not touching the p-type well region 11p2 directly in this structure, so the p-type well regions 11p1 and 11p2 may differ in electric potential.

An STI 20 is arranged between the p-type well region 11p1 and the n-type well region 11nd and between the p-type well region 11p2 and the n-type well region 11nd and each of the n-type well region 11nd and the p-type well regions 11p1 and 11p2 is defined in the p-type semiconductor substrate 10p.

With the semiconductor device 3 having the above triple well structure, a dummy active region 11nh may be arranged between the p-type well regions 11p1 and 11p2.

The reason for arranging the dummy active region 11nh in such a position is the same as that described in the first or second embodiment. That is to say, by performing a wafer process, n-type impurity ions are implanted under the dummy active region 11nh therethrough. As a result, a local region (n-type well region 11nd) in which impurity concentration is higher than impurity concentration in an n-type well region 11n and in which impurities deeply diffuse is formed under the dummy active region 11nh.

If the n-type well region 11nd is formed, a potential barrier between the n-type well region 11nd and the p-type well region 11p1 and a potential barrier between the n-type well region 11nd and the p-type well region 11p2 become higher. As a result, it is difficult for an electric current to flow between the n-type well region 11nd and the p-type well region 11p1 or between the n-type well region 11nd and the p-type well region 11p2. Accordingly, even if the p-type well regions 11p1 and 11p2 differ in electric potential, a leakage current which flows between the p-type well regions 11p1 and 11p2 is controlled under an allowable limit.

The same effects that are obtained by the semiconductor device 1 according to the first embodiment can be achieved by the semiconductor device 3 according to the third embodiment.

The numeric values or the materials described in the first through third embodiments are examples and other numeric values or materials may be used.

By adopting the above methods, a leakage current between n-type well regions or between p-type well regions is controlled.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that various changes, substitutions, and alterations could be made hereto without departing from the spirit and scope of the invention.

What is claimed is:

1. A method comprising:
    reading out original design data from a storage section of a patterning apparatus, the original design data including first data of a pair of first conduction type well regions arranged in a second conduction type well region arranged in a semiconductor substrate;
    generating second data using the original design data by a data processing section of the patterning apparatus, the second data including third data of a dummy active region defined as an opening region of an isolation region at a surface of the second conduction type well region between the pair of first conduction type well regions;
    generating fourth data by superimposing the second data on the original design data by the data processing section; and
    storing the fourth data in the storage section.

2. The method according to claim 1, wherein the generating of the second data includes generating the second data including the third data of the dummy active region defined in a region away from a surface of the semiconductor substrate under a wiring mainly composed of polycrystalline silicon.

3. The method according to claim 1, wherein the generating of the second data includes generating the second data including the third data of the dummy active region defined in a region away from a boundary between each first conduction type well region and the second conduction type well region.

4. The method according to claim 1, wherein the generating of the second data includes generating the second data including the third data of the dummy active region defined in a region except a region having a size which exceeds a limit of patterning by a dry or wet wafer process.

5. The method according to claim 1, wherein the generating of the second data includes generating the second data including the third data of the dummy active region defined in a region except a region having a size which exceeds a limit of patterning of a mask member used for patterning of the dummy active region.

6. The method according to claim 1, wherein in the generating of the second data, in a case of an electric current which exceeds an allowable limit flowing between the first conduction type well regions, the second data including the third data of the dummy active region is generated.

7. The method according to claim 1, wherein the dummy active region is a region for forming a well region under the dummy active region, and wherein impurity concentration in the well region is higher than impurity concentration in the second conduction type well region.

* * * * *